(12) United States Patent
Chen et al.

(10) Patent No.: US 9,570,348 B2
(45) Date of Patent: Feb. 14, 2017

(54) METHOD OF FORMING CONTACT STRUCUTRE

(71) Applicant: United Microelectronics Corp., Hsinchu (TW)

(72) Inventors: Pin-Hong Chen, Yunlin County (TW); Kuo-Chih Lai, Tainan (TW); Chia-Chang Hsu, Kaohsiung (TW); Chun-Chieh Chiu, Keelung (TW); Li-Han Chen, Tainan (TW); Shu-Min Huang, Tainan (TW); Min-Chuan Tsai, New Taipei (TW); Hsin-Fu Huang, Tainan (TW); Chi-Mao Hsu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/709,083

(22) Filed: May 11, 2015

(65) Prior Publication Data
US 2016/0336227 A1 Nov. 17, 2016

(51) Int. Cl.
*H01L 21/768* (2006.01)

(52) U.S. Cl.
CPC ... *H01L 21/76895* (2013.01); *H01L 21/76805* (2013.01); *H01L 21/76816* (2013.01); *H01L 21/76843* (2013.01); *H01L 21/76889* (2013.01)

(58) Field of Classification Search
CPC ............ H01L 21/76895; H01L 21/76805; H01L 21/76889; H01L 21/76843; H01L 21/76816
See application file for complete search history.

(56) References Cited

U.S. PATENT DOCUMENTS

| | | | | |
|---|---|---|---|---|
| 5,739,046 | A * | 4/1998 | Lur | H01L 21/28518 257/E21.165 |
| 5,903,053 | A * | 5/1999 | Iijima | H01L 29/45 257/751 |
| 5,929,526 | A * | 7/1999 | Srinivasan | H01L 21/76843 257/758 |
| 6,861,351 | B2 | 3/2005 | Sandhu et al. | |
| 8,357,978 | B1 * | 1/2013 | Baars | H01L 29/4966 257/288 |

* cited by examiner

*Primary Examiner* — Kyoung Lee
(74) *Attorney, Agent, or Firm* — J.C. Patents

(57) ABSTRACT

A method of forming a contact structure is provided. A silicon-containing substrate is provided with a composite dielectric layer formed thereon. An opening penetrates through the composite dielectric layer and exposes a portion of the source/drain region. A titanium nitride layer is formed in the opening, and the titanium nitride layer is in contact with the exposed portion of the source/drain region. The titanium nitride layer is annealed, so that the bottom portion of the titanium nitride layer is partially transformed into a titanium silicide layer. A conductive layer is formed to fill up the opening.

11 Claims, 10 Drawing Sheets

METHOD OF FORMING CONTACT STRUCUTRE

BACKGROUND OF THE INVENTION

Field of Invention

The present invention relates to a semiconductor process, and more particularly to a method of forming a contact structure.

Description of Related Art

MOS is a basic structure widely applied to various semiconductor devices, such as memory devices, image sensors and display devices. An electric device is required to be made lighter, thinner and smaller. The traditional MOS transistor is difficult to scale down due to the limitation of the fabricating process, and a multi-gate transistor with better properties is therefore developed.

In either a traditional MOS transistor or a multi-gate transistor, the aspect ratio of a contact opening becomes larger and larger as the device size is continuously scaled down. Complicated steps are usually implemented to form a high-aspect-ratio contact structure, and the process cost is thereby increased.

SUMMARY OF THE INVENTION

Accordingly, the present invention provides a method of forming a contact structure, in which simple steps are provided to form a contact structure at a low cost.

The present invention provides a method of forming a contact structure is provided. A silicon-containing substrate is provided with a composite dielectric layer formed thereon. An opening penetrates through the composite dielectric layer and exposes a portion of the source/drain region. A titanium nitride (TiN) layer is formed in the opening, and the titanium nitride layer is in contact with the exposed portion of the source/drain region. The titanium nitride layer is annealed, so that the bottom portion of the titanium nitride layer is partially transformed into a titanium silicide (TiSi) layer. A conductive layer is formed to fill up the opening.

According to an embodiment of the present invention, the bottom portion of the TiN layer is at least three times thicker than a sidewall portion of the TiN layer.

According to an embodiment of the present invention, the bottom portion of the TiN layer is three to five times thicker than the sidewall portion of the TiN layer.

According to an embodiment of the present invention, the step of forming the TiN layer includes performing a physical vapor deposition (PVD) process.

According to an embodiment of the present invention, the step of forming the TiN layer includes performing a radio frequency physical vapor deposition (RF PVD) process.

According to an embodiment of the present invention, an atomic ratio of Ti to N in the TiN layer ranges from about 0.7 to 1.3.

According to an embodiment of the present invention, the opening has an aspect ratio of greater than about 7.

According to an embodiment of the present invention, the step of annealing the TiN layer is performed at a temperature of about 500° C. to 650° C.

According to an embodiment of the present invention, the silicon-containing substrate is a substrate with multiple fins extending in a first direction, and the opening extending in a second direction different from the first direction.

According to an embodiment of the present invention, the source/drain region includes an epitaxial layer on one fin between two adjacent gates and a doped region in the epitaxial layer.

According to an embodiment of the present invention, the silicon-containing substrate is a bulk substrate.

According to an embodiment of the present invention, the source/drain region includes an epitaxial layer in the bulk substrate between two adjacent gates and a doped region in the epitaxial layer.

According to an embodiment of the present invention, the conductive layer includes tungsten, copper, aluminum or an alloy thereof.

In view of the above, in the present invention, a single PVD TiN layer is formed in the opening to connect the corresponding source/drain region, and an annealing step is immediately performed, so as to form a TiN barrier layer and an underlying TiSi ohmic contact layer from the single PVD TiN layer. With the method of the invention, the step of forming the conventional titanium glue layer can be omitted, so the cost competitive advantage can be easily achieved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
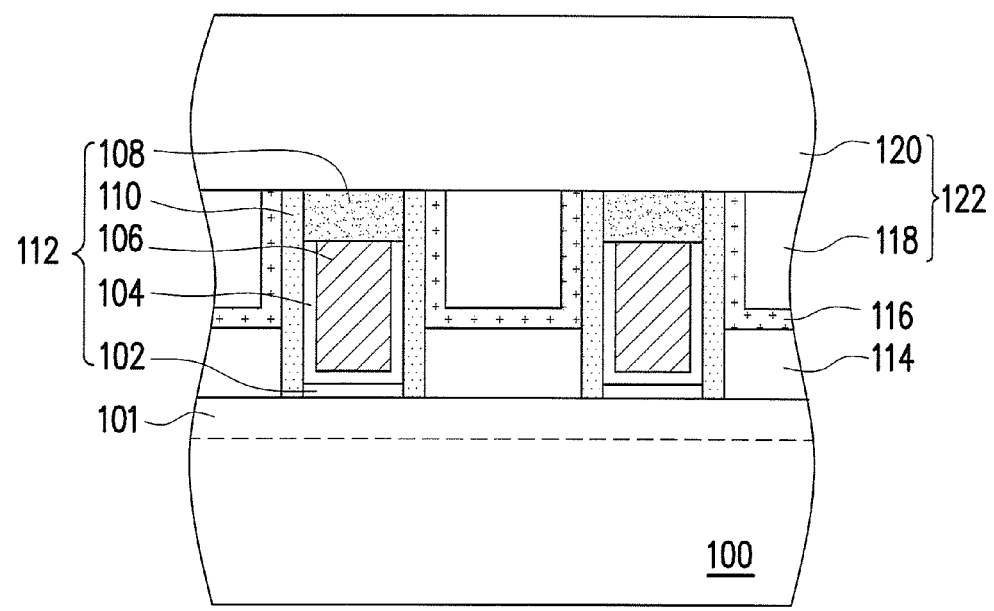
FIG. 1A to FIG. 1E are schematic cross-sectional views illustrating a method of forming a contact structure according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1A to FIG. 1E are schematic cross-sectional views illustrating a method of forming a contact structure according to a first embodiment of the present invention.

Referring to FIG. 1A, a silicon-containing substrate 100 is provided with multiple fins 101 extending in a first direction. The silicon-containing substrate 100 has multiple metal gates 112 formed thereon. The metal gates 112 cross the fins 101 and extend in a second direction different from the first direction. In an embodiment, the second direction is perpendicular to the first direction.

Each metal gate 112 includes, for example but not limited to, a metal layer 106, an interfacial layer 102 between the metal layer 106 and each fin 101 of the silicon-containing substrate 100, a cap layer 108 above the metal layer 106, a spacer 110 beside the metal layer 106, and a gate dielectric layer 104 between the metal layer 106 and each of the interfacial layer 102 and the spacer 110.

The metal layer 106 includes, for example but not limited thereto, a work function metal layer and a low low-resistivity metal layer. The work function metal layer includes TiN, TiAl$_x$, TaC, TaCNO, TaCN, TaN or a combination thereof. The low-resistivity metal layer includes W, Al, Cu or an alloy thereof. The interfacial layer 102 includes silicon oxide. The gate dielectric layer 104 includes a high-k material such as TiO$_2$, HfO$_2$, ZrO$_2$, Al$_2$O$_3$, La$_2$O$_3$, Y$_2$O$_3$, Gd$_2$O$_3$, Ta$_2$O$_5$, or a combination thereof. The cap layer 108 includes silicon nitride. The spacer 110 includes silicon oxide, silicon nitride, silicon oxynitride or a combination thereof. Besides, the material of the spacer 110 can be the same as or different from that of the cap layer 108.

The silicon-containing substrate 100 further has epitaxial layers 114 formed thereon. In an embodiment, the epitaxial layers 114 are formed on the fins 101 between the metal gates 112, and two adjacent metal gates 112 share one epitaxial layer 114. Besides, the epitaxial layers 114 cover the lower sidewalls of the spacers 110. The epitaxial layers 114 include SiGe, SiC or SiP.

The silicon-containing substrate 100 further has a contact etch stop layer (CESL) 116 and a composite dielectric layer 122 formed thereon. The composite dielectric layer 122 includes, for example but not limited thereto, a dielectric layer 118 and a dielectric layer 120. The CESL 116 and the dielectric layer 118 fill up the gaps between the metal gates 112 but expose the tops of the cap layers 108 of the metal gates 112. Specifically, the CESL 116 covers the top surfaces of the epitaxial layers 114 and the spacers 110 exposed by the epitaxial layers 114, and the dielectric layer 118 above the CESL 116 fills up the gaps between the metal gates 112. In other words, the CESL 116 is formed between each spacer 110 and the dielectric layer 118, and the dielectric layer 118 is formed to surround the spacers 110. The CESL 116 includes silicon nitride. A dielectric layer 120 covers the cap layers 108 and the dielectric layer 118. Each of the dielectric layer 118 and the dielectric layer 120 includes silicon oxide, a low-k material, a suitable insulating material or a combination thereof. Besides, the material of the dielectric layer 120 can be the same as or different from that of the dielectric layer 118.

Figure 1B:
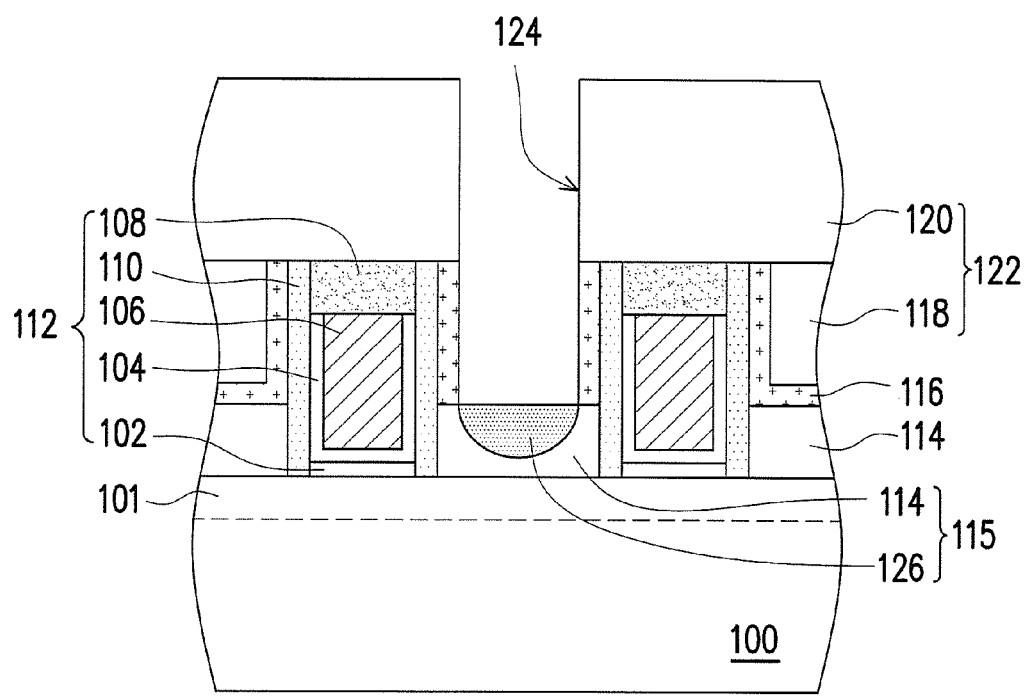

Referring to FIG. 1B, a portion of the composite dielectric layer 122 is removed to form at least one opening 124 therein. In an embodiment, the opening 124 has an aspect ratio of greater than about 7. The removing step includes a photolithography step followed by an etching step. The removing step simultaneously removes a portion of the CESL 116, so that the opening 124 exposes a portion of the epitaxial layer 114 between two adjacent metal gates 112. In an embodiment, the removing step is performed by using the CESL layer 116 as an etching stop layer, so the CESL 116 beside the opening 124 is exposed and formed as an I-shape, as shown in FIG. 1B. Herein, the step of forming the contact opening 124 is also called a self-aligned contact (SAC) etching process. In this embodiment, the opening 124 has a substantially vertical sidewall, but the present invention is not limited thereto. In another embodiment, the opening 124 can have a tilted sidewall.

Thereafter, a doped region 126 is formed in the corresponding epitaxial layer 114 exposed by each opening 124. The doped region 126 is formed with an ion implantation process. Each doped region 126 and the corresponding epitaxial layer 114 constitute a source/drain region 115 of the device. One source/drain region 115 is disposed between two adjacent metal gates 112.

In view of steps of FIG. 1A and FIG. 1B, a silicon-containing substrate 100 is provided with a composite dielectric layer 122 formed thereon, wherein an opening 124 penetrates through the composite dielectric layer 122 and exposes a portion of the corresponding source/drain region 115. In this embodiment, the silicon-containing substrate 100 is a substrate with multiple fins 101 extending in a first direction, and the opening 124 extending in a second direction different from (e.g., perpendicular to) the first direction. Besides, the source/drain region 115 of this embodiment includes an epitaxial layer 114 on one fin 101 between two adjacent gates (e.g., metal gates 112) and a doped region 126 in the epitaxial layer 114.

Figure 1C:
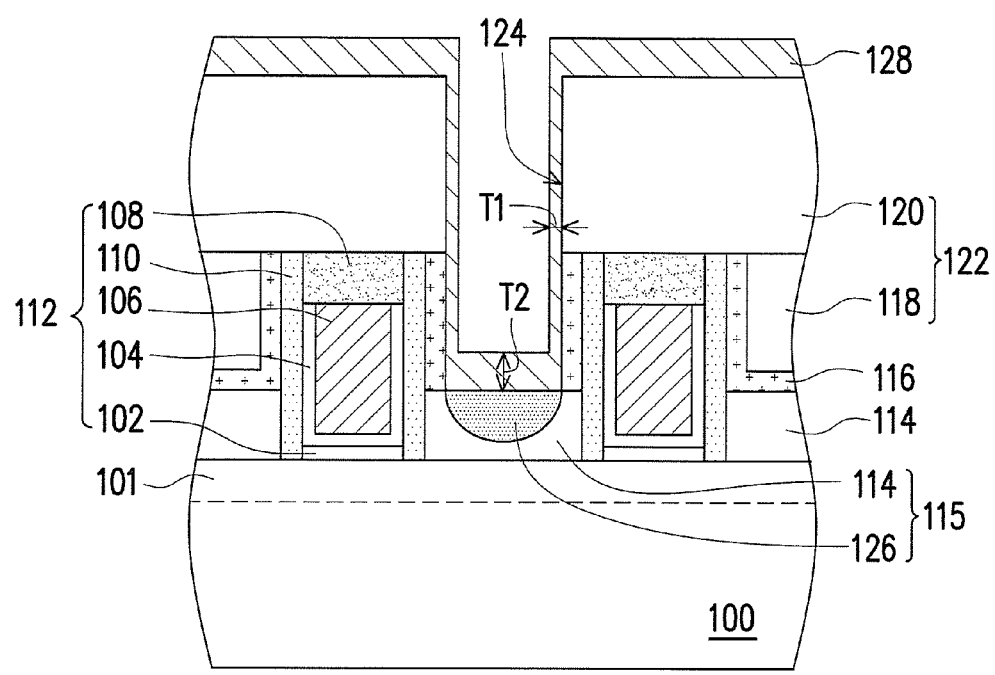

Referring to FIG. 1C, a titanium nitride (TiN) layer 128 is formed in the opening 124, and the TiN layer 128 is in contact with the exposed portion of the source/drain region 115. In other words, the TiN layer 128 is formed directly on the top of the dielectric layer 120 and on the surface of the opening 124 without a titanium glue layer between the TiN layer 128 and the source/drain region 115. In an embodiment, the bottom or horizontal portion of the TiN layer 128 is at least three times (e.g., three to five times) thicker than the sidewall or vertical portion of the TiN layer 128. Specifically, the thickness T2 of the bottom portion of the TiN layer 128 is at least three times (e.g., three to five times) greater than the thickness T1 of the sidewall portion of the TiN layer 128, as shown in FIG. 1C. The method of forming the TiN layer 128 includes performing a physical vapor deposition (PVD) process, such as a radio frequency physical vapor deposition (RF PVD) process, a direct current physical vapor deposition (DC PVD) process or a pulsed DC PVD process. In an embodiment, the TiN layer 128 is formed with a RF PVD process, in which a titanium target is adopted, the RF power ranges from about 3,000 to 5,000 watts, the substrate temperature is set at about 300° C. to 400° C., and the flow rate ratio of N$_2$ to Ar ranges from about 1.3:1 to 1.4:1.

Figure 1D:
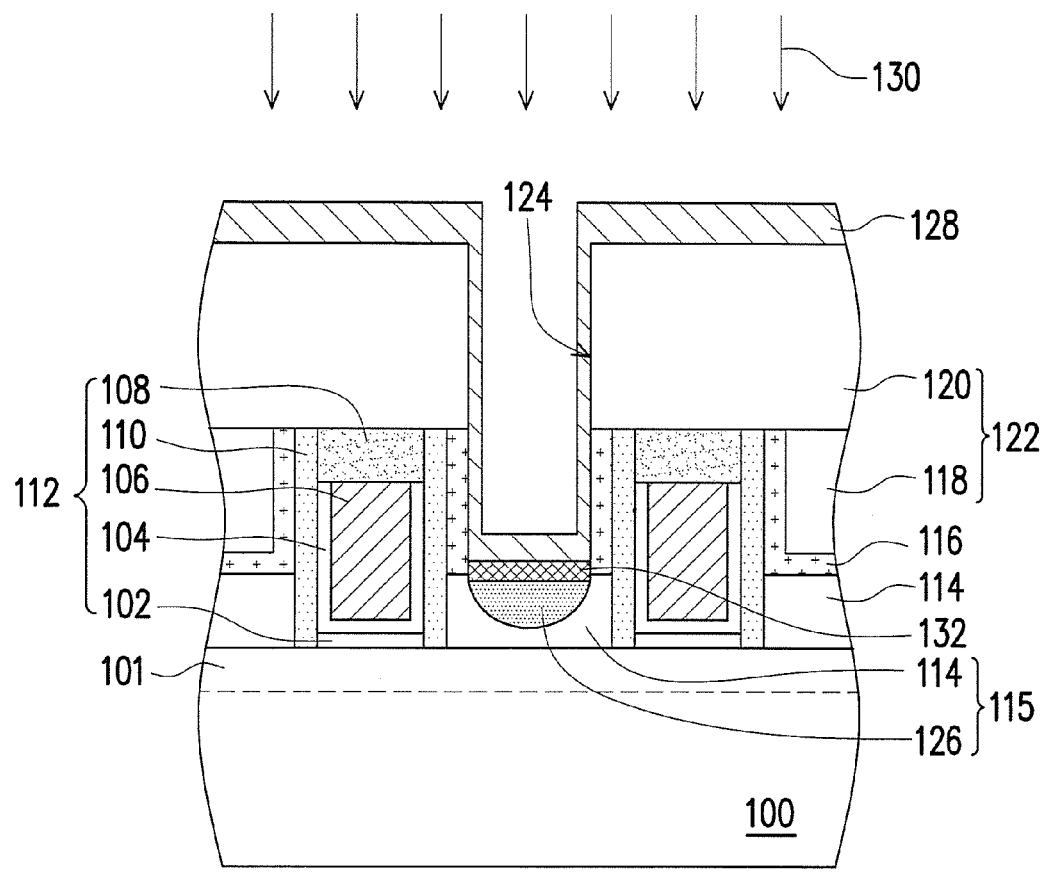

Referring to FIG. 1D, the TiN layer 128 is annealed with an annealing step 130, so that the bottom portion of the TiN layer 128 is partially transformed into a titanium silicide (TiSi) layer 132. Specifically, in the annealing step 130, a part of the bottom portion of the TiN layer 128 is reacted to a portion of the source/drain region 115 and then transformed into the TiSi layer 132 as a metallic low resistance region, and the remaining part of the bottom portion and the sidewall portion of the TiN layer 128 function as a barrier layer. The annealing step 130 is performed at a temperature of about 500° C. to 650° C. under an inert gas (e.g., nitrogen) atmosphere for about 10 seconds to 50 seconds.

It is noted that in the present invention, the atomic ratio of Ti to N in the TiN layer 128 ranges from about 0.7 to 1.3. In an embodiment, the atomic ratio of Ti to N in the TiN layer 128 can be, for example but not limited to, about 0.7, 0.8, 0.9, 1.0, 1.1, 1.2, 1.3, including any range between any two of the preceding values. The atomic ratio of Ti to N in the TiN layer 128 is such as to ensure the formation of the TiSi layer 132 during the annealing step 130.

Figure 1E:
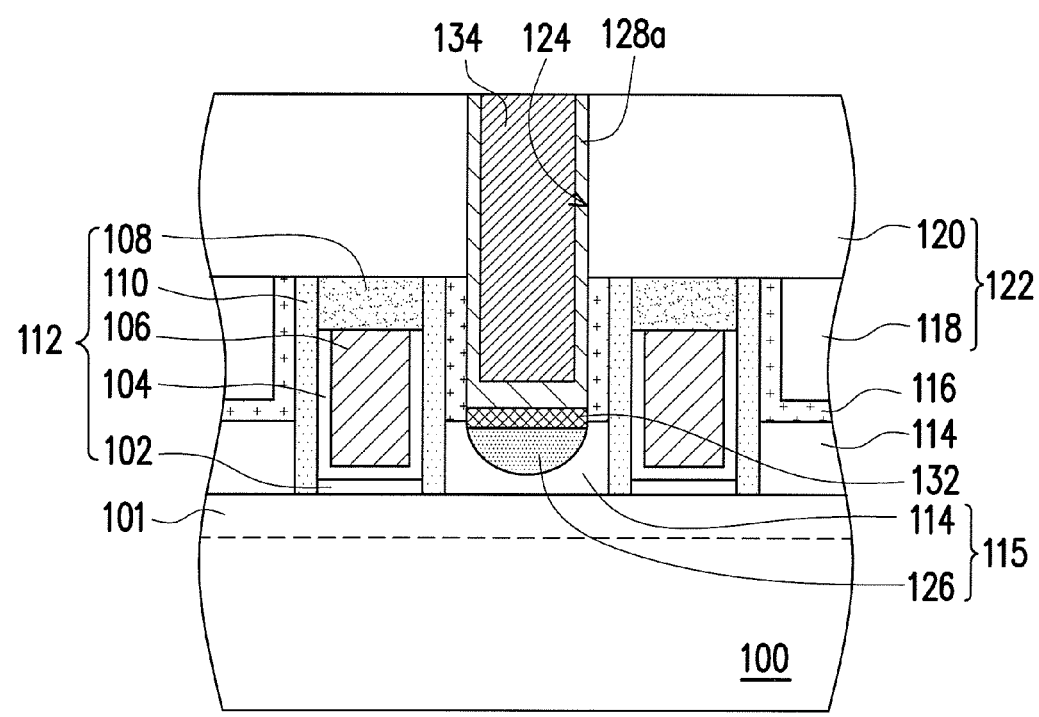

Referring to FIG. 1E, a conductive layer 134 is formed to fill up the opening 124. The method of forming the conductive layer 134 includes forming a conductive material layer on the TiN layer 128 filling up the opening 124. The conductive material layer includes tungsten, copper, aluminum or an alloy thereof, and the forming method thereof includes performing a chemical vapour deposition (CVD) process or an electroplating process. Thereafter, portions of the TiN layer 128 and the conductive material layer outside of the opening 124 are removed, and thus, a barrier layer 128a and a conductive layer 134 are retained in the opening 124. The removing step includes performing a chemical mechanical polishing (CMP) process. The fabrication of the contact structure of the present invention is thus completed.

It is noted that the method of the invention omits the step of forming the conventional titanium glue layer, so the contact structure can be formed with fewer steps at a lower cost. Specifically, in the conventional method, two steps of respectively forming a titanium glue layer and a titanium nitride barrier layer are required prior to the annealing step. However, in the present invention, a single TiN PVD process combined with a single annealing step are implemented to simultaneously form a TiN barrier layer and an underlying TiSi ohmic contact layer. Therefore, the cost competitive advantage can be easily achieved with the method of the invention.

It is also noted that in the present invention, the PVD TiN layer is formed thinner on the sidewall while thicker on the bottom of the contact opening, and such thickness configuration can prevent the opening from being narrowed and therefore avoid the bad metal filling issue in a high-aspect-ratio contact opening. Specifically, each of the conventional titanium glue layer and the conventional titanium nitride layer is usually formed with a substantially equal thickness on the sidewall and bottom of the opening. However, the uniform thickness may narrow the opening size and therefore increase the aspect ratio of the opening, so voids may be generated during the subsequent metal filling step. Such issue is not observed in the present invention.

The first embodiment in which the described method is applied to form a contact structure of a Fin Field-Effect Transistor (FinFET) device is provided for illustration purposes, and is not construed as limiting the present invention. It is appreciated by people having ordinary skill in the art that the described method can be applied to form a contact structure of a planar device including a metal gate or a polysilicon gate.

Second Embodiment

FIG. 2A to FIG. 2E are schematic cross-sectional views illustrating a method of forming a contact structure according to a second embodiment of the present invention. The difference between the second and first embodiments mainly lies in that the substrate of the second embodiment is a bulk substrate while the substrate of the first embodiment is a substrate with fins. The difference is illustrated in details below, and the similarity is not iterated herein.

Figure 2A:
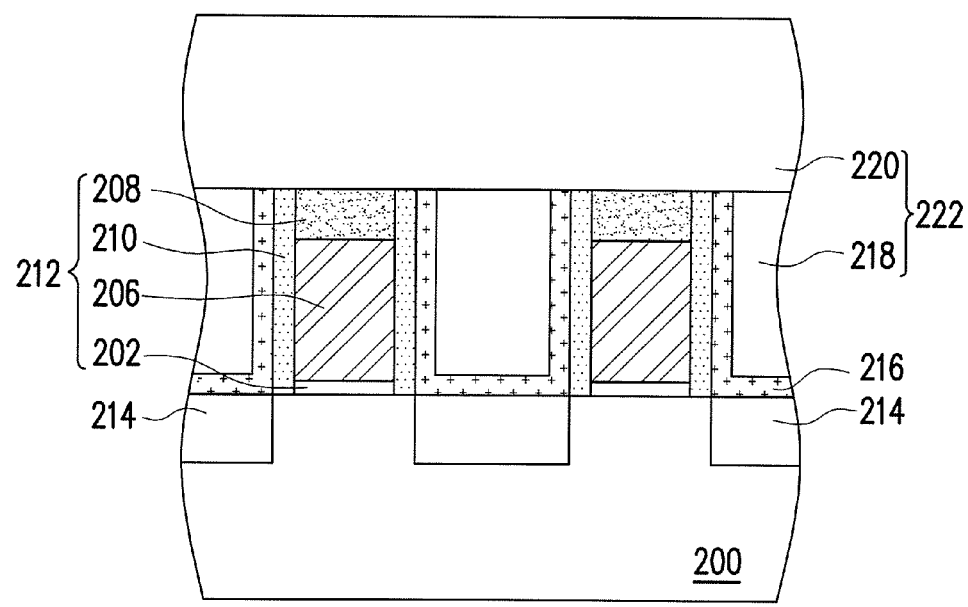
FIG. 2A to FIG. 2E are schematic cross-sectional views illustrating a method of forming a contact structure according to a second embodiment of the present invention.

Referring to FIG. 2A, a silicon-containing substrate 200 is provided. The silicon-containing substrate 200 is a bulk substrate. The silicon-containing substrate 200 has multiple gates 212 formed thereon. The gates 212 can be metal gates or polysilicon gates. Each gate 212 includes, for example but not limited to, a gate layer 206, a gate dielectric layer 202 between the gate layer 206 and the silicon-containing substrate 200, a cap layer 208 above the gate layer 206, and a spacer 210 beside the gate layer 206.

The gate layer 106 includes metal (e.g., Al or Cu) or polysilicon. The gate dielectric layer 202 includes silicon oxide, a high-k material or a combination thereof. The cap layer 208 includes silicon nitride. The spacer 210 includes silicon oxide, silicon nitride, silicon oxynitride or a combination thereof.

The silicon-containing substrate 200 further has epitaxial layers 214 formed therein. In an embodiment, the epitaxial layers 214 are formed in the silicon-containing substrate 200 between the gates 212, and two adjacent gates 212 share one epitaxial layer 214. The epitaxial layers 214 include SiGe, SiC or SiP.

The silicon-containing substrate 200 further has an optional CESL 216 and a composite dielectric layer 222 formed thereon. The composite dielectric layer 222 includes, for example but not limited thereto, a dielectric layer 218 and a dielectric layer 220. The CESL 216 covers the spacers 210 and the top surfaces of the epitaxial layers 214. The dielectric layer 218 above the CESL 216 fills up the gaps between the gates 212 but exposes the tops of the cap layers 208 of the gates 212. A dielectric layer 220 covers the cap layers 208 and the dielectric layer 218. The materials of the CESL 216 and the composite dielectric layer 222 are similar to those of the CESL 116 and the composite dielectric layer 122 described in the first embodiment, and the details are not iterated herein.

Figure 2B:
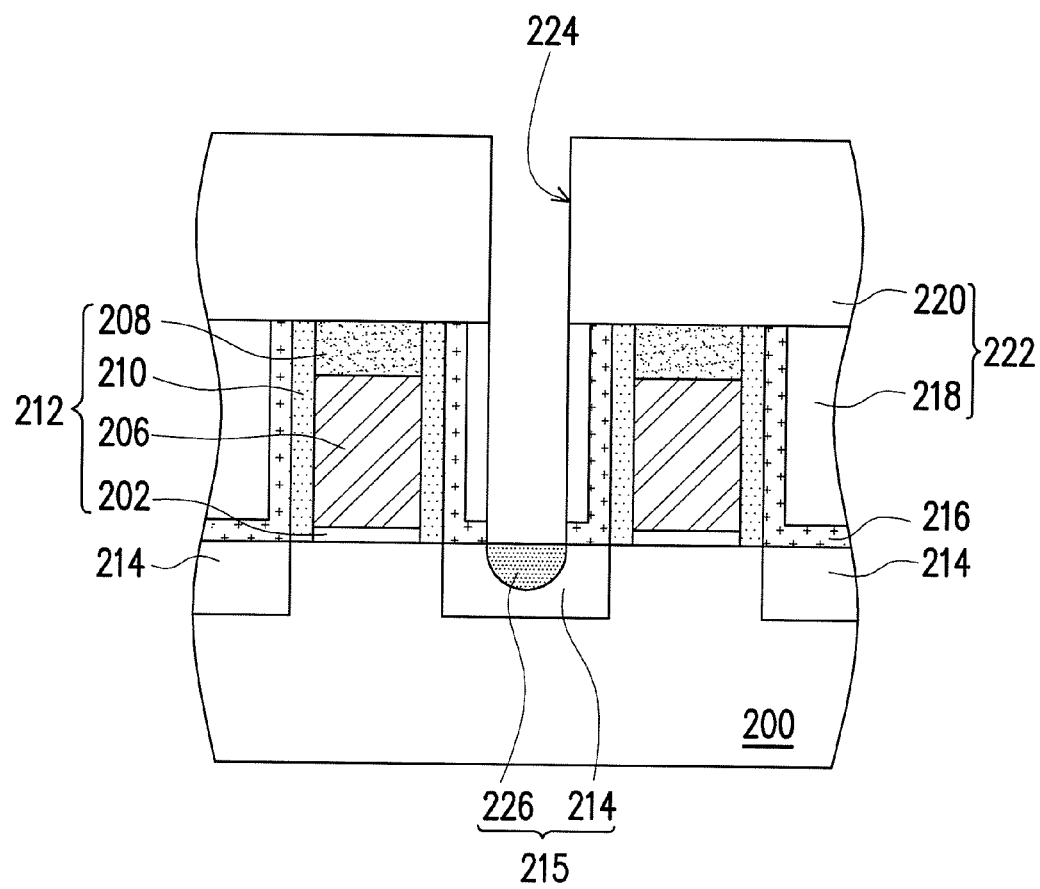

Referring to FIG. 2B, a portion of the composite dielectric layer 222 is removed to form at least one opening 224 therein. In an embodiment, the opening 224 has an aspect ratio of greater than about 7. The removing step includes a photolithography step followed by an etching step. The removing step simultaneously removes a portion of the CESL 216. In an embodiment, upon the removing step, the CESL 216 is formed as an L-shape, as shown in FIG. 2B, but the present invention is not limited thereto. In another embodiment, the removing step is performed by using the CESL layer 216 as an etching stop layer, so the CESL 216 beside the opening 224 is exposed and formed as an I-shape.

Thereafter, a doped region 226 is formed in the corresponding epitaxial layer 214 exposed by each opening 224. The doped region 226 is formed with an ion implantation process. Each doped region 226 and the corresponding epitaxial layer 214 constitute a source/drain region 215 of the device. Each source/drain region 215 is disposed between two adjacent gates 212.

In view of steps of FIG. 2A and FIG. 2B, a silicon-containing substrate 200 is provided with a composite dielectric layer 222 formed thereon, wherein an opening 224 penetrates through the composite dielectric layer 222 and exposes a portion of the source/drain region 215. In this embodiment, the silicon-containing substrate 200 is a bulk substrate without fins. Besides, the source/drain region 215 of this embodiment includes an epitaxial layer 214 in the substrate 200 between two adjacent gates 212 and a doped region 226 in the epitaxial layer 214.

Figure 2C:
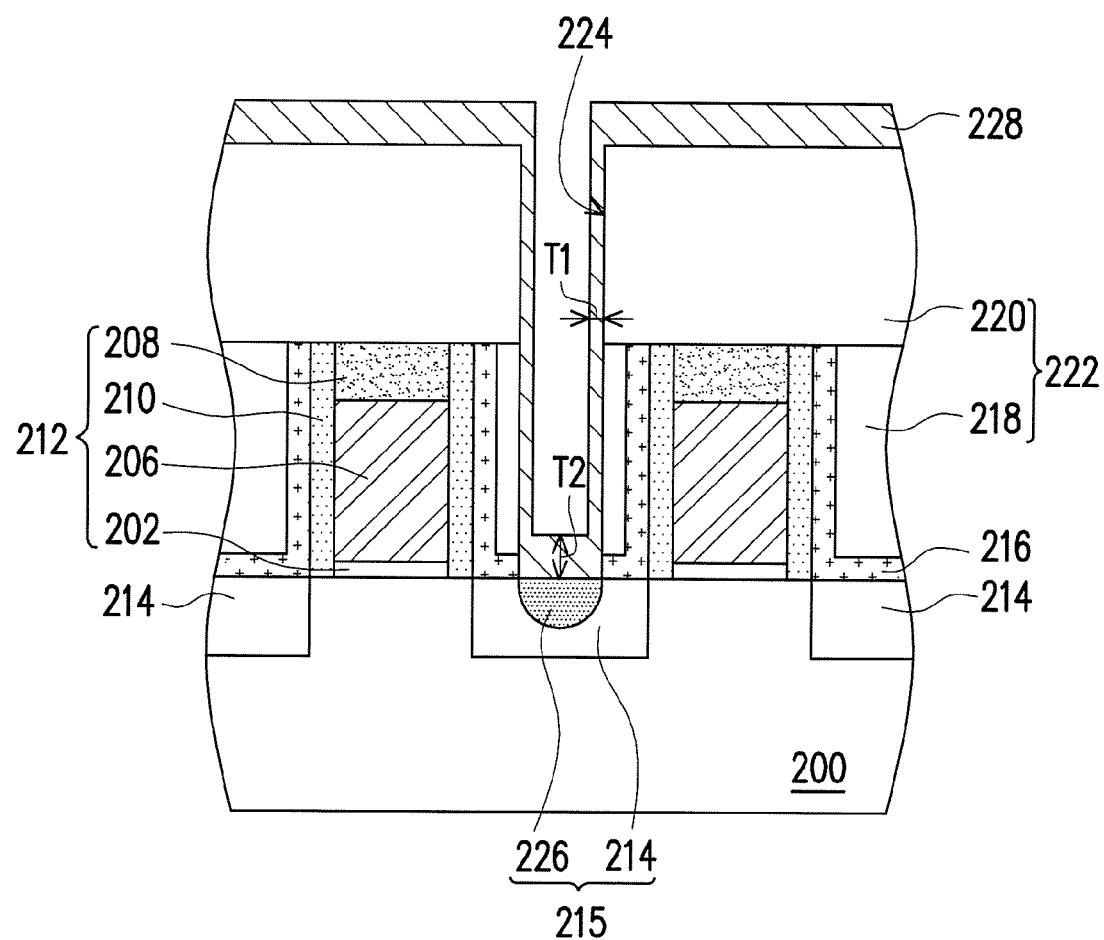

Referring to FIG. 2C, a TiN layer 228 is formed in the opening 224, wherein the TiN layer 228 is in contact with the exposed portion of the source/drain region 215. The TiN layer 228 is formed with a PVD process, such as a RF PVD process. The thickness configuration of the TiN layer 228 is similar to that of the TiN layer 128 described in the first embodiment, and the details are not iterated herein.

Figure 2D:
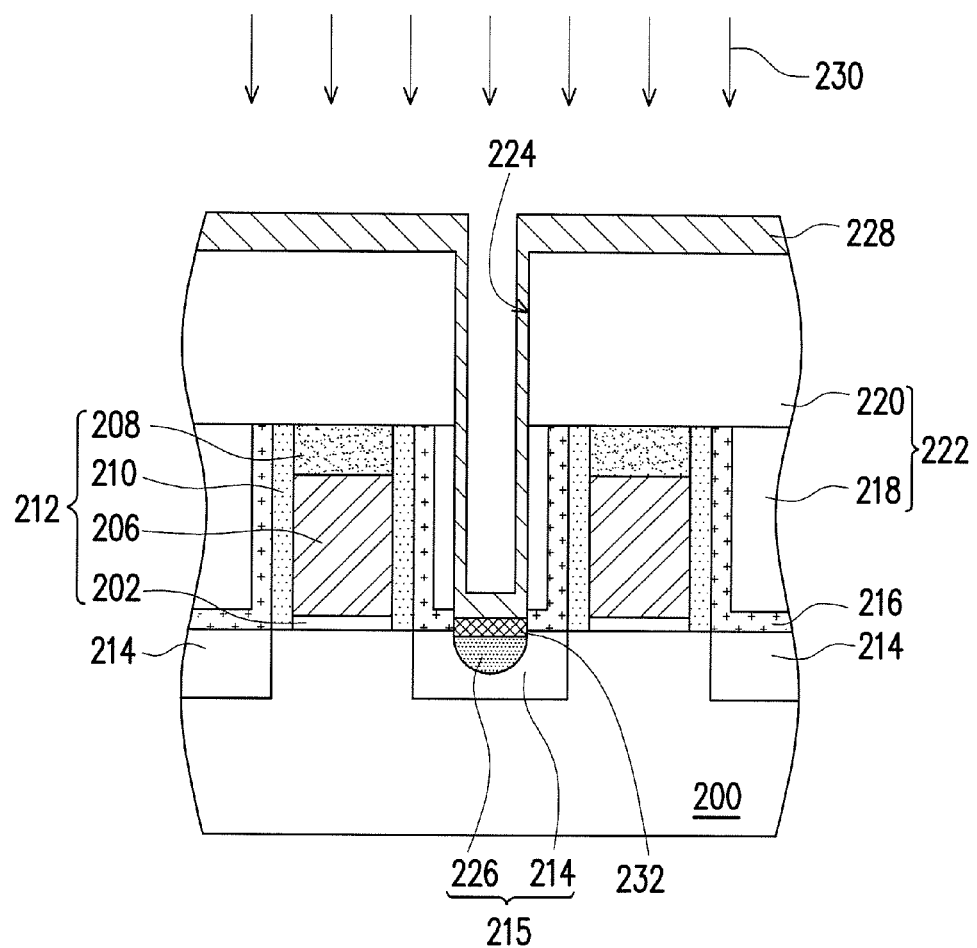

Referring to FIG. 2D, the TiN layer 228 is annealed with an annealing step 230, so that the bottom portion of the TiN layer 228 is partially transformed into a TiSi layer 232. The annealing step 230 is similar to the annealing step 130 described in the first embodiment, and the details are not iterated herein.

Figure 2E:
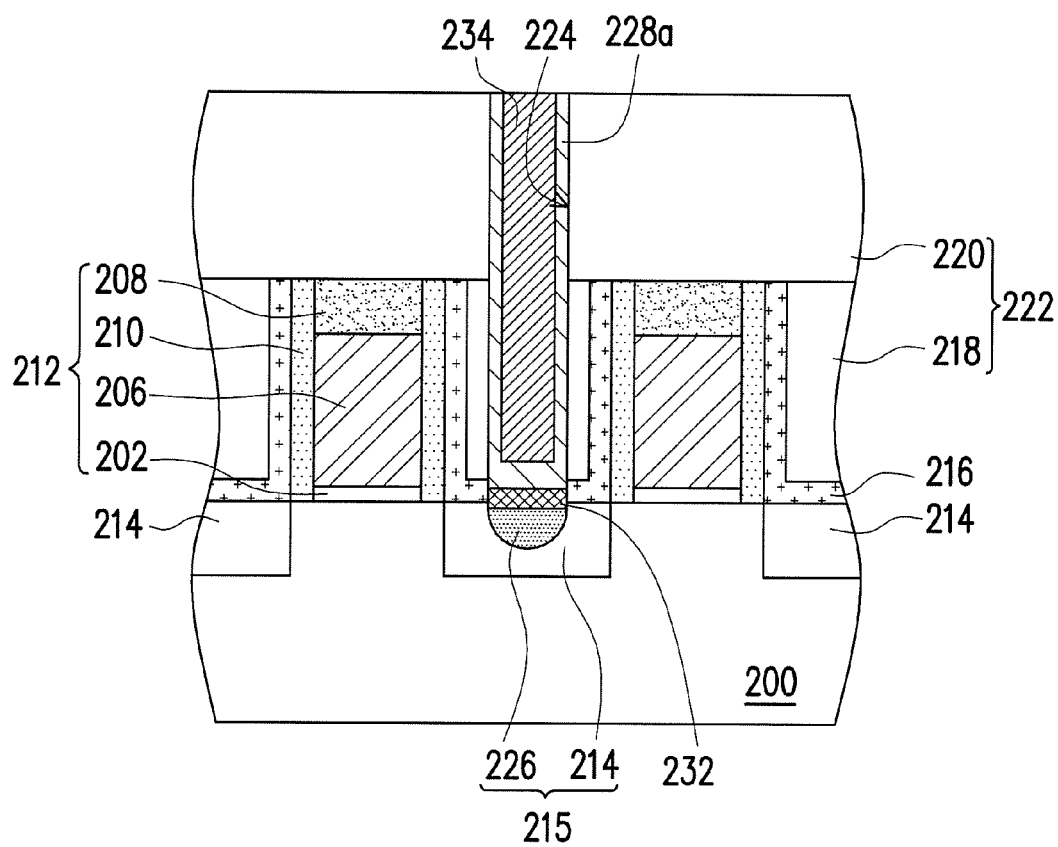

Referring to FIG. 2E, a conductive layer 234 is formed to fill up the opening 224. The material and forming method of the conductive layer 234 is similar to those of the conductive layer 134 described in the first embodiment, and the details are not iterated herein.

In the first and second embodiments, the PVD TiN layer is formed thinner on the sidewall while thicker on the bottom of the opening. The thinner sidewall portion of the PVD TiN layer can prevent the opening from being narrowed and therefore avoid the bad metal filling issue in a high-aspect-ratio contact opening. The thicker bottom portion of the PVD TiN layer can render a part thereof to form a TiSi ohmic contact layer while retain another part thereof to serve as a TiN barrier layer.

The present invention further provides a method of forming a contact structure. A silicon-containing substrate is provided with a composite dielectric layer formed thereon. An opening penetrates through the composite dielectric layer and exposes a portion of the source/drain region. A metal nitride layer is formed in the opening, and the metal nitride layer is in contact with the exposed portion of the source/drain region. The metal nitride layer is annealed, so that the bottom portion of the metal nitride layer is partially transformed into a metal silicide layer. A conductive layer is formed to fill up the opening. In an embodiment, the metal nitride layer is titanium nitride layer and the metal silicide layer is a titanium silicide layer.

In summary, with the method of the invention, a single TiN PVD process is performed to replace the conventional two steps of respectively forming a titanium glue layer and a titanium nitride barrier layer. Thereafter, an annealing step is performed to simultaneously form a TiN barrier layer and an underlying TiSi ohmic contact layer from the single PVD TiN layer. Since the step of forming the conventional titanium glue layer can be omitted in the present invention, the cost competitive advantage can be easily achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a contact structure, comprising:
providing a silicon-containing substrate having a composite dielectric layer formed thereon, wherein an opening penetrates through the composite dielectric layer and exposes a portion of the source/drain region;
forming a titanium nitride (TiN) layer in the opening, wherein the TiN layer is in contact with the exposed portion of the source/drain region;
annealing the TiN layer, so that a bottom portion of the TiN layer is partially transformed into a titanium silicide (TiSi) layer; and
forming a conductive layer to fill up the opening,
wherein the silicon-containing substrate is a substrate with multiple fins extending in a first direction, and the opening extending in a second direction different from the first direction.

2. The method of claim 1, wherein the bottom portion of the TiN layer is at least three times thicker than a sidewall portion of the TiN layer.

3. The method of claim 1, wherein the bottom portion of the TiN layer is three to five times thicker than the sidewall portion of the TiN layer.

4. The method of claim 1, wherein the step of forming the TiN layer comprises performing a physical vapor deposition (PVD) process.

5. The method of claim 1, wherein the step of forming the TiN layer comprises performing a radio frequency physical vapor deposition (RF PVD) process.

6. The method of claim 1, wherein an atomic ratio of Ti to N in the TiN layer ranges from about 0.7 to 1.3.

7. The method of claim 1, wherein the opening has an aspect ratio of greater than about 7.

8. The method of claim 1, wherein the step of annealing the TiN layer is performed at a temperature of about 500° C. to 650° C.

9. The method of claim 1, wherein the source/drain region comprises an epitaxial layer on one fin between two adjacent gates and a doped region in the epitaxial layer.

10. The method of claim 1, wherein the conductive layer comprises tungsten, copper, aluminum or an alloy thereof.

11. A method of forming a contact structure, comprising:
providing a silicon-containing substrate having a composite dielectric layer formed thereon, wherein an opening penetrates through the composite dielectric layer and exposes a portion of the source/drain region;
forming a titanium nitride (TiN) layer in the opening, wherein the TiN layer is in contact with the exposed portion of the source/drain region;
annealing the TiN layer, so that a bottom portion of the TiN layer is partially transformed into a titanium silicide (TiSi) layer; and
forming a conductive layer to fill up the opening,
wherein the silicon-containing substrate is a bulk substrate, and
wherein the source/drain region comprises an epitaxial layer in the bulk substrate between two adjacent gates and a doped region in the epitaxial layer.

* * * * *